(12) United States Patent
Kawai

(10) Patent No.: US 6,628,181 B2
(45) Date of Patent: Sep. 30, 2003

(54) TUNING CIRCUIT HAVING A RESONANCE CIRCUIT AND A NEGATIVE RESISTANCE CIRCUIT

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 10/099,319

(22) Filed: Mar. 15, 2002

(65) Prior Publication Data

US 2002/0163406 A1 Nov. 7, 2002

(30) Foreign Application Priority Data

Mar. 21, 2001 (JP) ......................... 2001-080835

(51) Int. Cl.[7] .................. H03H 11/52; H03H 11/00
(52) U.S. Cl. .................. 333/214; 333/217; 333/213
(58) Field of Search ................. 333/217, 214, 333/213, 216, 175; 331/105, 108, 115

(56) References Cited

U.S. PATENT DOCUMENTS

| | | | | |
|---|---|---|---|---|
| 4,338,582 A | * | 7/1982 | Presser | ...................... 333/175 |
| 5,451,915 A | * | 9/1995 | Katzin et al. | ................ 333/213 |
| 5,539,761 A | * | 7/1996 | Golub et al. | .............. 372/38.02 |
| 6,239,664 B1 | * | 5/2001 | Northam | ........................ 42/16 |
| 6,504,458 B2 | | 1/2003 | Kawai | |
| 6,545,570 B2 | | 4/2003 | Kawai | |

* cited by examiner

Primary Examiner—Patricia Nguyen
(74) Attorney, Agent, or Firm—Flynn, Thiel, Boutell & Tanis, P.C.

(57) ABSTRACT

A tuning circuit is constructed to set Q of the tuning circuit to a high desired value by using a negative resistance value.

The tuning circuit is made to oscillate weakly by using a negative resistance circuit, a voltage-resistance converter and a digital-analog converter. A negative resistance of the negative resistance circuit is scanned by a counter so that two negative resistance values corresponding to an oscillation amplitude and another oscillation amplitude of one half are obtained by analog comparators $COMP_1$ and $COMP_2$. A negative resistance value to be set is operated by an adder/subtracter from a series resistance value corresponding to a desired Q and this value. Scanning is stopped when the negative resistance value is obtained. The tuning circuit can be formed by small size digital integrated circuits.

5 Claims, 2 Drawing Sheets

TUNING CIRCUIT HAVING A RESONANCE CIRCUIT AND A NEGATIVE RESISTANCE CIRCUIT

BACKGROUND OF THE INVENTION

1. Field of the Invention

The present invention relates to a tuning circuit capable of increasing Q thereof up to a desired predetermined value wherein a negative resistance circuit is added to a resonance circuit comprising an inductor and an capacitor.

2. Description of the Related Art

There are methods using a negative resistance circuit as a method for increasing Q of a tuning circuit. As one of them a regeneration detection method has been many used. However, it is necessary to set up a positive feedback circuit whenever a tuning frequency is changed because the positive feedback circuit is used on the eve of oscillation and a set up value thereof is not constant.

There is an automatic setting method of a tuning frequency in order to improve this drawback, which is disclosed in Japanese Patent Application No. 2000-400944. According to said method, in such condition as to oscillate a tuning circuit weakly, a resistance component of the tuning circuit is obtained by the operation from relation between a negative resistance value and an oscillation signal amplitude when the oscillation signal amplitude is varied by scanning the negative resistance value. Since this method requires several numeric operation comprising multiplication and division, it is very complicated and it is impossible to hold operation result completely.

Further, there is a method disclosed in Japanese Patent Application No. 2001-19748 to improve this drawbacks. This method has such merits that a circuit for it can be miniaturized and it is possible to hold operation result completely because most of the circuit may be constituted to operate digitally but it has such demerit that detection accuracy of standard time (a time when the oscillation signal amplitude becomes zero) to determine operation accuracy.

SUMMARY OF THE INVENTION

An object of the invention is to provide a tuning circuit capable of setting Q thereof to a desired high predetermined value by a very simple circuit wherein this standard time can be detected simply and accurately because it is impossible to detect the standard time accurately by the method of Japanese Patent Application No. 2001-19748.

In order to achieve the above object, a tuning circuit of the invention comprises a resonance circuit consisting of an inductor and a capacitor and a negative resistance circuit connected to the resonance circuit in series;

negative resistance control means for setting a negative resistance value of the negative resistance value to make an effective resistance value of the tuning circuit to be negative so as to oscillate and for varying said negative resistance value in positive direction;

stop holding means for holding a first negative resistance value when an amplitude of an oscillation signal outputted from said resonance circuit becomes a first predetermined value and for outputting a second negative resistance value when said amplitude becomes a second predetermined value of half of the first predetermined value to stop varying of said negative resistance value; and operating means for operating the negative resistance value of said negative resistance circuit to obtain a desired Q of the tuning circuit from said first and second negative resistance values.

In the invention, it is preferred that a negative resistance amending value corresponding to time delay of variance of the oscillation signal due to variance of the negative resistance value is applied to said operating means.

Further, in the invention, it is preferred that said negative resistance control means comprises a counter for counting clock signals to control the negative resistance value in accordance with the count output of the counter and said stop holding means comprises first and second comparators for detecting that said oscillation signal becomes the first and second predetermined values respectively and a latch circuit for holding said second negative resistance value.

Furthermore, in the invention, it is preferred that the second negative resistance value from said second comparator is shifted by one bit so as to make it be two times and is applied to said operating means.

In addition, in the invention, it is preferred to include means for disconnecting an input and an output of the tuning circuit therefrom.

DESCRIPTION OF THE PREFERRED EMBODIMENTS

A basic construction of the invention is described above and can be realized by various conventional circuits. The principle for setting desired Q of a tuning circuit having the above construction is as follows.

In the invention, a negative resistor is introduced into a tuning circuit to cause it to oscillate weakly like prior art. The effective series resistance component $r_d$ of the tuning circuit for setting Q thereof to a desired value is determined as follows.

Figure 1A:
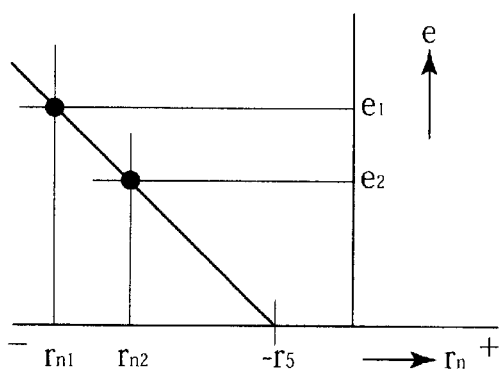
FIGS. 1 and 2 are graphs for explaining behavior of the invention.

If a resistance value of an original series resistance component of the tuning circuit is $r_s$ and a negative resistance value $r_{n1}$ of a negative resistor circuit connected to the tuning circuit is $r_{n1}$, a resistance value $r_1$ of a composite resistor of them is $r_1 = r_s + r_{n1}$. Further, if a resistance value of the negative resistor becomes $r_{n2}$, a resistance value $r_2$ of the composite resistor becomes $r_2 = r_s + r_{n2}$. If the negative resistance values are laid on a axis and the oscillation signal amplitudes corresponding to them are laid on a Y axis, relation between them can be indicated as shown in FIG. 1(a). Since the original resistor component $r_s$ of the tuning circuit is obtained from the following equation (1).

$$rs = \frac{r_{n1} - r_{n2}}{\frac{e_1}{e_2} - 1} - r_{n2} \tag{1}$$

according to the prior art, the negative resistor circuit is set to a value $(r_d - r_s)$ which is obtained by subtracting said value $r_s$ from a series resistance component $r_d$ to obtain a desired Q of the tuning circuit. Therefore, this prior art method requires several operations including multiplication and division to obtain $r_s$ of equation (1).

Figure 1B:
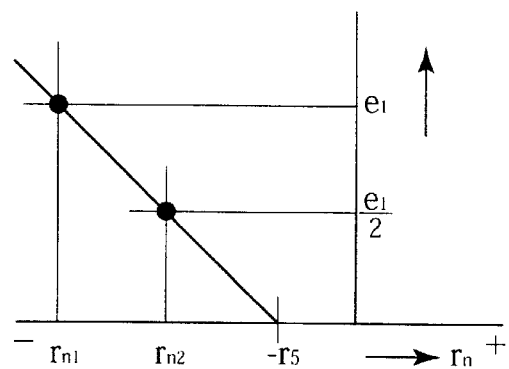

So, according to the invention, only a specific value defined by relation $e_1/e_2=2$ is used as shown in FIG. 1(b) without using arbitrary amplitudes as the oscillation signal amplitudes $e_1$, $e_2$ respectively. As a result, the equation (1) becomes the following equation (2) and simple.

$$r_s = r_{n1} - 2r_{n2} \quad (2)$$

In addition, this equation requires operation of two times but since the operation of two times corresponds to 1 bit-shift if this operation is done with binary code, operation of the equation (2) can be done by means of one bite shift and subtraction. Further, said operation can be done by using the equation (2) without detection of time when the oscillation signal amplitude becomes zero, which is problem in the prior art.

Furthermore, scanning of a negative resistor circuit is done rapidly to do quick setting of tuning frequency, so that if delay time of a low pass filter in an oscillation signal amplitude detecting circuit is not negligible due to relative relation between scanning speed thereof and response characteristics of the low pass filter, error in the operation of $r_s$ happens.

Figure 2:
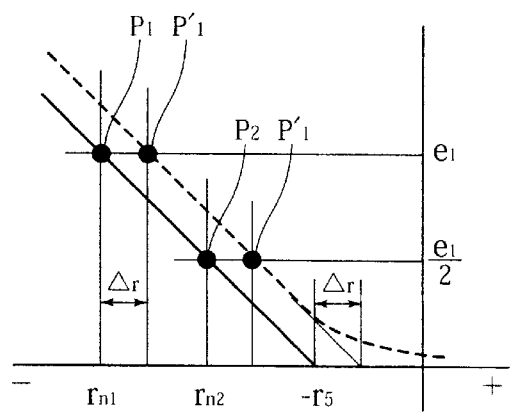

However, this problem is solved as follows. That is, since as shown in FIG. 2 relation of a solid line in FIG. 1 varies as shown with dotted line due to the delay time, the points $P_1$ and $P_2$ shift to the points $P'_1$ and $P'_2$ respectively by resistor variation $\Delta_r$ corresponding to the delay time. Accordingly, if $r_{n1}$ and $r_{n2}$ in the equation (2) are delayed by $\Delta_r$ and the value of $r_s$ at this time is $r'_s$, $r'_s$ is indicated by the following equation (3).

$$r'_s = (r_{n1} + \Delta_r) - 2(r_{n2} + \Delta_r) = r_{n1} - 2r_{n2} - \Delta_r \quad (3)$$

This means that the original resistor component in the tuning circuit is regarded erroneously as if its value is small by $\Delta_r$. Therefore, it is necessary to do amendment for it when $\Delta_r$ is not negligible with respect to $r_s$. The dimension of $\Delta_r$ is not time, but resistance as is apparent from the above explanation.

As is explained in the above, if an effective series resistance value to set Q to a desired value is $r_d$, the value $r_N$ to be set in a negative resistor circuit is $r_N = r_d - r_s$. If a converting coefficient of a negative impedance converter is −1, $-r_N = r_d + r_s$ may be applied to the negative impedance converter. However, if the delay time is not negligible, $-r_N$ is given by the following equation (4) because $r_s$ is obtained as $r'_s$ actually.

$$-r_N = -r_d + (r'_s + \Delta_r) \quad (4)$$

Since $r'_s$ is obtained by measurement, amendment is done so as to obtain $-r_d + \Delta_r$ by inserting $\Delta_r$ to the setting value of $r_d$.

In this way, complicated operation and detection of the zero point of an oscillation signal amplitude can be overcome and miniaturization can be realized by using a plurality of small general digital ICs.

An embodiment of the present invention will be explained in detail by referring to the drawings as follows.

Figure 3:
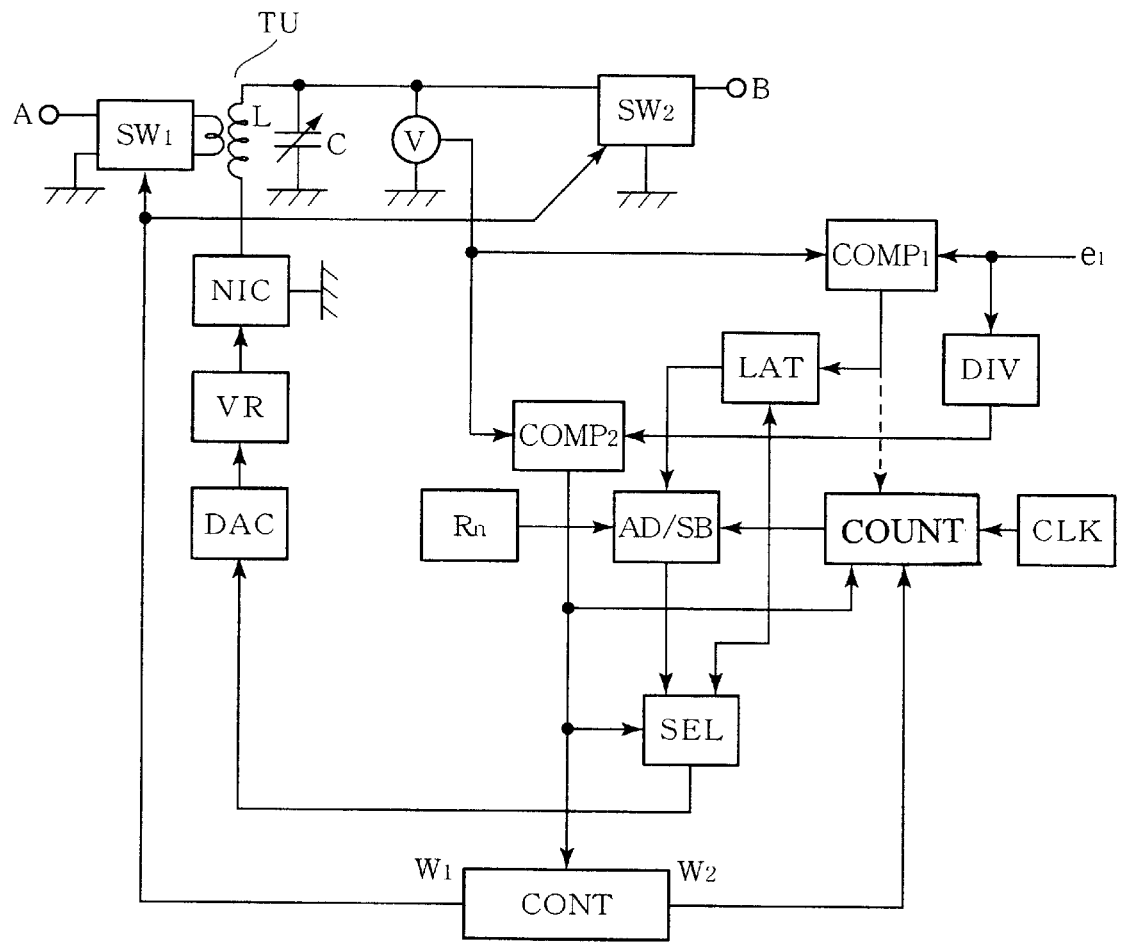
FIG. 3 is a circuitry structural drawing for explaining an embodiment of the invention.

FIG. 3 is a circuit diagram showing said embodiment. In the same figure, A is an input terminal of a RF signal from an antenna or a RF amplifier and etc., B is a signal output terminal, $SW_1$ and $SW_2$ are switch circuits, L and C are an inductor and a capacitor for tuning of a resonance circuit which constitutes a tuning circuit, V is a signal amplitude detecting circuit, $COMP_1$ and $COMP_2$ are analog comparators, LAT is a latch circuit, $e_1$ is a reference voltage, DIV is a voltage divider, CLK is a clock signal generating circuit, COUNT is a binary counter, AD/SB is an adder/subtracter, $R_n$ is a Q setting signal generator, SEL is a selector, CONT is a control signal generating circuit, $W_1$ and $W_2$ are output lines thereof, DAC is a digital-analog converter, VR is a voltage converter, and NIC is a negative impedance converter.

In the above embodiment, the negative resistor control means is constructed by the clock signal generating circuit CLK, the binary counter COUNT, the selector SEL, the digital-analog converter DAC, the voltage-resistance converter VR and the negative impedance converter NIC. The stop holding means is constituted by the signal amplitude detecting circuit V, the analog comparators $COMP_1$ and $COMP_2$, the latch circuit LAT and the voltage divider DIV. The setting operation means is constituted by the Q setting signal generator $R_{17}$ and an adder/subtracter AD/SB.

In the above embodiment, firstly, the capacitor C is controlled to set a desired tuning frequency prior to setting of Q and the switch circuits $SW_1$ and $SW_2$ are made off by a control signal from the control signal generating circuit CONT through the output line $W_1$, so that the tuning circuit is disconnected from the input and output terminals. This is done to protect input and output circuits (not shown) connected to A and B from influence owing to an oscillation signal.

Nextly, the binary counter COUNT begins to count the clock signal from the clock signal generating circuit CLK by the control signal from the control signal generating circuit CONT through the output line $W_2$ so that an output of the negative impedance converter NIC from a negative resistance value to a positive resistance value through a value of $r_{n1}$ (an output of the counter applies a negative resistance to the tuning circuit through the selector SEL, the digital-analog connector DAC, the voltage-resistance converter VR and the negative impedance converter NIC). In this way, the counter output scans to provide a negative resistance through the selector SEL, the digital-analog converter DAC, the voltage-resistance converter VR and the negative impedance converter NIC. Since it is complicated to explain that the tuning circuit operates through these circuits one after another, operation will be explained by simplifying its expression as if the negative resistance is provided by the counter output directly.

The tuning circuit oscillates weakly by applying the negative resistance thereto. An oscillation signal is detected and smoothed by the signal amplitude detecting circuit V and is applied to the analog comparators $COMP_1$ and $COMP_2$, so that it is compared with the reference voltage $e_1$ in $COMP_1$ and is compared with the reference voltage $e_2$ in $COMP_2$.

Firstly, the negative resistance is set so as to provide an amplitude of the oscillation signal larger than $e_1$. Then count up progresses (Employment of count up or count down depends on polarity relation between an input and an output in the digital-analog converter DAC, the voltage-resistance converter VR and the negative impedance converter NIC but count up is employed here) and the oscillation signal amplitude passes through $e_1$. At the moment the analog comparator $COMP_1$ detects it and a count value (corresponding to the negative resistance value $r_{n1}$) is latched in the latch circuit LAT (refer to later explanation as to connection of the $COMP_1$ shown by a dotted line). Further, count up progresses and the oscillation signal amplitude passes through $e_1/2$. At the moment the analog comparator $COMP_2$ detects it to stop the count of the counter COUNT. At this time the count value of the counter COUNT becomes the value corresponding to the negative resistance value $r_{n2}$. This value is shifted by one bit to make it twice when it is applied to the adder/subtracter AD/SB.

On the other hand, the Q setting signal generator $R_D$ produces a setting signal corresponding to the series resistance value $r_d$ to obtain a desired Q ($\Delta_r$ is added to it in case that it is necessary to amend the delay time of said low pass filter). This setting value and said both values $r_{n1}$, $r_{n2}$ are applied to the adder/subtracter AD/SB and $r_s$ indicated by the equation (4) is obtained. The selector SEL is switched from the counter output to the adder/subtracter AD/SB by an output of the analog comparator $COMP_2$ to produce a setting value $r_N$ to obtain a desired Q and thus Q is set to a desired value, which is kept thereafter.

Figure 4:
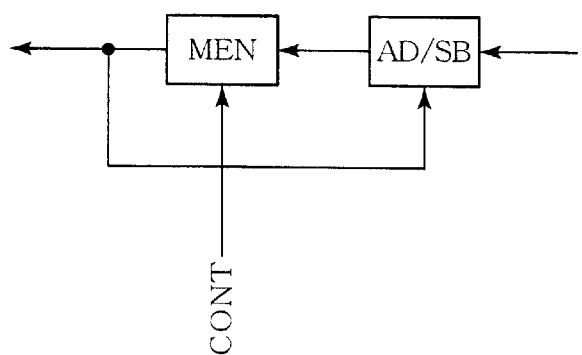
FIG. 4 is a circuitry structural drawing of another embodiment of the invention wherein an accumulating circuit is used as a substitute for a counter.

Since the control signal generating circuit CONT makes the switch circuits SW1 and $SW_2$ on when Q is set to the desired value by the $COMP_2$ output, receiving operation is made possible. In this case a memory MEN as an accumulating circuit as shown in FIG. 4 may be used in spite of the counter COUNT.

The above is explanation of detailed operation of the circuit shown in FIG. 3 but such operation can be done by the following method.

Since the following equation (5) is obtained by modifying the equation (2), operation of the equation (5) may be done in spite of that of the equation (2).

$$-r_s = r_{n1} - 2(r_{n1} - r_{n2}) \qquad (5)$$

This means that $-r_s$ is obtained by subtracting a value of two times of difference between $r_{n1}$ and $r_{n2}$ from $r_{n1}$.

This operation can be done by adding a dotted line to the output of $COMP_1$ in FIG. 3. That is, when $e_1$ is obtained, a value of the counter output corresponding to $r_{n1}$ is latched in the latch circuit LAT by the output of the comparator $COMP_1$ and the counter is reset once. Then it is caused to start count again. Since the counter content becomes a value corresponding to $(r_{n1}-r_{n2})$ when $e_1/2$ is obtained, at this time the counter is stopped and the counter output is applied to the adder/subtracter AD/SB after it is shifted by one bit. Since necessary components are obtained by the above operation, a value to be set is obtained by the adder/subtracter AD/SB and is kept thereafter.

As explained in detail, according to the invention, since it is possible to set Q to a desired high value automatically even if a tuning frequency is varied, always stable receiving can be done with high selectivity and in addition most of a circuit therefor can be constituted by small general digital IC except the switch circuit, the negative impedance converter and the amplitude detecting circuit. Further even a small low Q inductor can be used by utilizing merits of this circuit.

What is claimed is:

1. A tuning circuit comprising a resonance circuit consisting of an inductor and a capacitor and a negative resistance circuit connected to the resonance circuit in series;

negative resistance control means for setting a negative resistance value of the negative resistance circuit to make an effective resistance value of the tuning circuit to be negative so as to oscillate and for varying said negative resistance value in positive direction;

stop holding means for holding a first negative resistance value when an amplitude of an oscillation signal outputted from said resonance circuit becomes a first predetermined value and for outputting a second negative resistance value when said amplitude becomes a second predetermined value of half of the first predetermined value to stop varying of said negative resistance value; and operating means for operating the negative resistance value of said negative resistance circuit to obtain a desired Q of the tuning circuit from said first and second negative resistance values.

2. A tuning circuit according to claim 1, wherein a negative resistance amending value corresponding to time delay of variance of the oscillation signal due to variance of the negative resistance value is applied to said operating means.

3. A tuning circuit according to claim 1, wherein said negative resistance control means comprises a counter for counting clock signals to control the negative resistance value in accordance with a count output of the counter and said stop holding means comprises first and second comparators for detecting that said oscillation signal becomes the first and second predetermined values respectively and a latch circuit for holding said second negative resistance value.

4. A tuning circuit according to claim 3, wherein the second negative resistance value from said second comparator is shifted by one bit so as to make it be two times and is applied to said operating means.

5. A tuning circuit according to claim 1, comprising means for disconnecting an input and an output of the tuning circuit therefrom.

* * * * *